(12) United States Patent
Takaoka et al.

(10) Patent No.: US 7,232,995 B2
(45) Date of Patent: Jun. 19, 2007

(54) METHOD OF REMOVING PARTICLE OF PHOTOMASK USING ATOMIC FORCE MICROSCOPE

(75) Inventors: Osamu Takaoka, Chiba (JP); Masatoshi Yasutake, Chiba (JP); Shigeru Wakiyama, Chiba (JP); Naoya Watanabe, Chiba (JP)

(73) Assignee: SII NanoTechnology Inc. (JP)

( * ) Notice: Subject to any disclaimer, the term of this patent is extended or adjusted under 35 U.S.C. 154(b) by 137 days.

(21) Appl. No.: 11/185,657

(22) Filed: Jul. 20, 2005

(65) Prior Publication Data

US 2006/0022134 A1    Feb. 2, 2006

(30) Foreign Application Priority Data

Jul. 28, 2004    (JP)    ............................. 2004-219937

(51) Int. Cl.
*G21K 7/00*    (2006.01)

(52) U.S. Cl. ........................ 250/309; 250/306; 250/307

(58) Field of Classification Search ................ 250/307, 250/309, 306
See application file for complete search history.

(56) References Cited

U.S. PATENT DOCUMENTS

| 5,508,517 | A | * | 4/1996 | Onuki et al. ................. 250/306 |
| 5,866,807 | A | * | 2/1999 | Elings et al. .................. 73/105 |
| 5,939,623 | A | * | 8/1999 | Muramatsu et al. ........... 73/105 |
| 6,289,717 | B1 | * | 9/2001 | Thundat et al. ............... 73/23.2 |
| 6,452,170 | B1 | * | 9/2002 | Zypman et al. ............. 250/306 |
| 6,583,411 | B1 | * | 6/2003 | Altmann et al. ............. 250/306 |
| 2002/0024004 | A1 | * | 2/2002 | Shimada et al. ............. 250/216 |
| 2005/0150280 | A1 | * | 7/2005 | Tang et al. .................... 73/105 |
| 2005/0247117 | A1 | * | 11/2005 | Shimada et al. ............... 73/105 |

* cited by examiner

*Primary Examiner*—Nikita Wells
*Assistant Examiner*—Johnnie L Smith, II
(74) *Attorney, Agent, or Firm*—Adams & Wilks

(57) ABSTRACT

The kind of a particle is determined by pressing a hard atomic force microscope stylus having a spring constant equal to or larger than 300 N/m onto a particle to be removed and detecting bending quantity relative to a press force and a kind of a stylus used for removing the particle is changed in accordance with the kind of the particle.

6 Claims, 2 Drawing Sheets

METHOD OF REMOVING PARTICLE OF PHOTOMASK USING ATOMIC FORCE MICROSCOPE

BACKGROUND OF THE INVENTION

The present invention relates to a method of removing a particle of a photomask by applying an atomic force microscope technology.

A micromachining technology of a nanometer order is requested for high function formation and high integration formation, and research and development of a machining technology of local anodic oxidation or microscratch machining using a scanning probe microscope (SPM) are intensely carried out. Not only a pursuit for a possibility of micromachining but also a pursuit for machining of an accurate shape or with high accuracy have been requested.

For example, recently, in an apparatus on the basis of an atomic force microscope (AFM), high accuracy correction of a micropattern surplus defect of a photomask is carried out by microscratch machining in which scanning is carried out with exerting a high press force (high load) on a stylus harder than a material to be machined and physical removal is carried accordingly for machining (Nonpatent Reference 1).

In accordance with a progress in miniaturization of lithography, a size of a particle to be removed on a silicon wafer becomes small, a and sufficient resolution cannot be obtained an optical microscope so that the particle is now observed by a scanning electron microscope or an atomic force microscope. Although removal of a particle is heretofore dependent on removal by cleaning, in the case of a small number of particles, the silicon wafer may conversely be contaminated at a cleaning step, and a method of effectively removing a small number of particles has been requested. Recently, there is also reported a method of applying an atomic force microscope technology used for observation as a method of removing a small number of fine particles on a silicon wafer (Nonpatent Reference 2).

Similar to the silicon wafer, also in the case of a photomask, with increased miniaturization of lithography, a size of a particle to be removed becomes small and a method of removing a particle which cannot be removed by cleaning is requested. When a particle is present at a photomask before being pasted with a pellicle, even when the number of particles is small, defects are produced in all of patterns to be transcribed and therefore, the particles need to be removed completely. There are various kinds of particles on a photomask such as a metal, a glass bump, a resist residue and the like and in order to ensure an optical property, there has been requested a method of removing a particle without damaging a quartz or glass substrate of a matrix as much as possible.

In order to remove a particle, it is necessary to know the kind of the particle since a method of removing a particle differs by the kind of the particle. There has been known a method of pressing a diamond stylus having a sharp tip to a particle and predicting Young's modulus of the particle from bending of a cantilever or a depth of an impression produced by the pressing and predicting a material of the particle from a value of Young's modulus as an indentation method. Recently, there has been carried out a nanoindentation method for executing an indentation method by attaching a diamond stylus having a tip diameter equal to or smaller than 100 nm to an atomic force microscope as a new application of the atomic force microscope as a method of predicting a material by calculating a hardness of a small region. The method provides a function of predicting a material of even a small object of a particle or the like.

[Nonpatent Reference 1] T. Amanao, M. Nishiguch, H. Hashimoto, Y. Morikawa, N. Hayashi, R. White, R. Bozak, and L. Terrill, Proc. of SPIE 5256 538–545 (2003)

[Nonpatent Reference 2] Junichi Muramoto, Hitoshi Kuniyasu, Tsuyoshi Hattori, Proceeding of 51st Conference of Applied Physics No. 2, 31p-B-2, p856 (2004)

It is an object of the invention to reduce damage on a quartz or glass substrate in removing a small particle on a photomask using an atomic force microscope technology.

SUMMARY OF THE INVENTION

With regard to a particle on a photomask which is not removed by cleaning, a kind of the particle is determined by pressing a hard atomic force microscope stylus having a spring constant of a spring constant equal to or larger than 300 N/m to the particle and detecting bending relative to a press force, or accurately measuring a depth of an impression produced when pressed with a constant load by a stylus which is slender and is provided with a high aspect ratio, and a kind of a stylus used for removing the particle is changed in accordance with the kind of the particle.

When a particle is softer than a quartz or glass substrate, the particle is moved or physically removed by an atomic force microscope stylus harder than the particle and softer than the quartz or glass substrate. When a particle is equal to or harder than the quartz or glass substrate, the particle is physically removed by scanning the hard stylus having the spring constant equal to or larger than 300 N/m used for pressing the particle with a high load.

ADVANTAGE OF THE INVENTION

A hardness of the particle to be removed is known by detecting bending relative to the press force or accurately measuring the depth of the impression produced when pressed with a constant load by the stylus which is slender and provided with the high aspect ratio and therefore, the kind of the particle to be removed can be determined from the hardness.

With regard to a soft particle, the particle is moved or physically removed by the atomic force microscope stylus softer than the quartz or glass substrate and therefore, the quartz or glass substrate is not damaged. Only in the case of a particle equivalent to or harder than the quartz or glass substrate, the particle is physically removed by the hard stylus such as diamond and therefore, a case having a possibility of damaging the substrate can be reduced.

DETAILED DESCRIPTION OF THE INVENTION

An embodiment of the invention will be explained in reference to the drawings as follows.

Figure 1A:
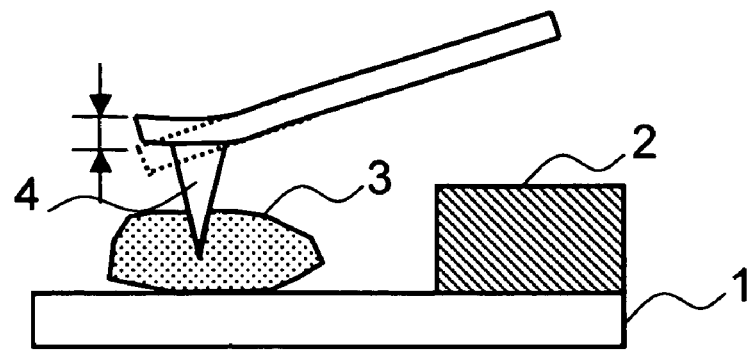
FIGS. 1A–1C illustrate schematic sectional views for explaining a case of removing a particle by determining a kind of the particle by detecting bending relative to a press force.
Figure 1B:
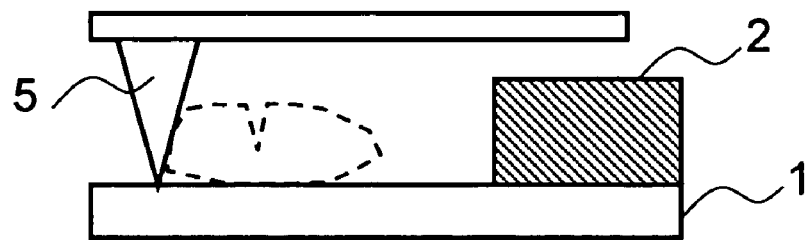
Figure 1C:
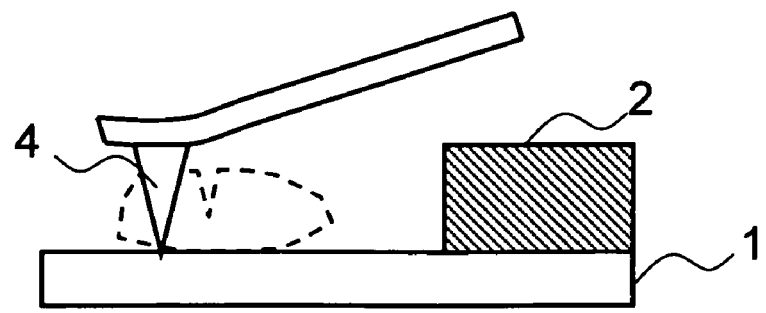

FIGS. 1A–1C are a schematic sectional views showing a method of removing a particle by determining a kind of the particle.

A photomask having light blocking film pattern 2 in which photomask a particle is found by a defect inspection apparatus is introduced into an atomic force microscope apparatus and an XY stage is moved such that a position of the particle 3 found by the defect inspection apparatus is brought into a field of view of the atomic force microscope apparatus. The position of the particle 3 is confirmed by observing a region including the particle 3 by a low load or intermittent contact mode such that the region including the particle 3 is not damaged. A hard atomic force microscope needle 4 of diamond or the like having a spring constant equal to or larger than 300 N/m is brought to right above the particle 3 as shown by FIG. 1A and the hard stylus 4 is pressed from above the particle. Information of hardness is acquired by detecting bending relative to the press force, and a kind of the particle is determined from the hardness information. In the case of the spring constant of 300 N/m, the stylus 4 can be pressed to a comparatively hard object of a quartz or a glass substrate.

There are particles of different materials such as metal, a resist residue, an MoSi residue, or a projection of glass. Since the material differs, the hardness naturally differs. There are kinds of particles of a metal, a resist residue, an MoSi residue, projection of glass and the like and the kind of the particle can be determined from the hardness.

In determining the kind of the particle at the above-described step, when the particle 3 to be removed is a metal particle or a residue of a resist softer than the quartz or a glass substrate 1, as shown by FIG. 1B, the hard stylus is replaced by an atomic force microscope stylus 5 comprising a material harder than a particle of silicon and softer than the quartz or glass substrate, and the particle is moved or physically removed by scanning the stylus 5 while pressing the particle at a side face of the stylus 5. The particle 3 can be removed without damaging the quartz or glass substrate 1 since the atomic force microscope stylus 5 harder than the particle 3 and softer than the quartz or glass substrate is used.

When the particle 3 to be removed is a glass bump having a hardness equivalent to that of the quartz or glass substrate 1, in FIG. 1A, the stylus 4 pressed into the particle is temporarily pulled up and as shown by FIG. 1C, the particle 3 is physically removed by scanning only a region of the particle 3 with a load higher than a load of using the hard atomic force microscope stylus 4 in observation as it is without replacing the atomic force microscope stylus.

Figure 2A:
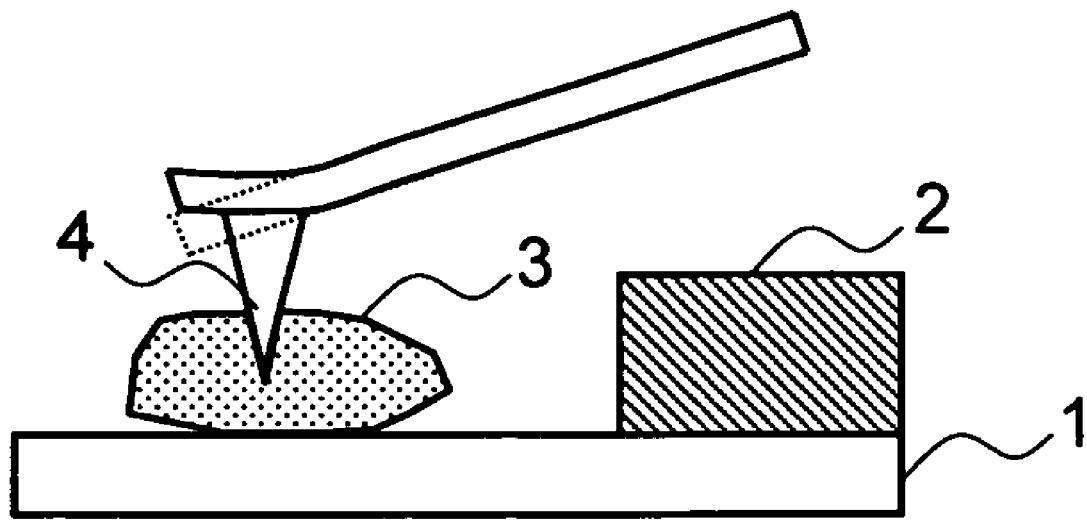
FIGS. 2A–2B illustrate schematic sectional views for explaining a case of removing a particle by determining a kind of the particle by accurately measuring a depth of an impression produced by pressing the particle by a stylus which is slender and provided with a high aspect ratio.
Figure 2B:
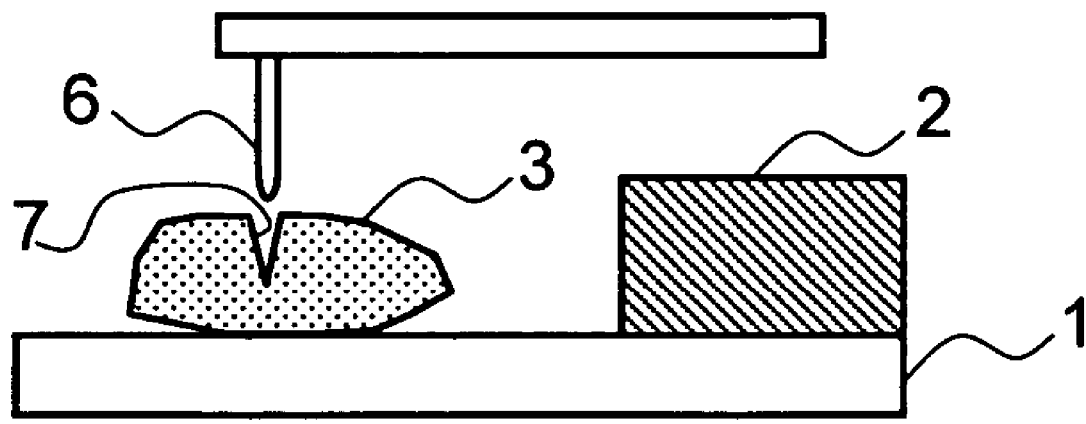

FIGS. 2A–2B are schematic sectional views showing another method of determining a kind of a particle.

First, as shown by FIG. 2A, the hard atomic force microscope stylus 4 is pressed with a constant load. Next, as shown by FIG. 2B, the atomic force microscope stylus 4 is replaced by a stylus 6 which is slender and provided with a high aspect ratio such as a carbon nanotube and an impression 7 produced by pressing the stylus 4 is scanned and a depth thereof is measured. By accurately measuring the depth of the impression 7, the hardness of the particle 3 is predicted and the kind of the particle 3 is determined from the predicted hardness information.

When the kind of the particle 3 is determined, the particle is removed similar to the embodiment of FIGS. 1A–1C. That is, with regard to the particle 3 softer than the quartz or glass substrate, the stylus is replaced by a stylus 5 harder than the particle and softer than the quartz or glass substrate such that the quartz or glass substrate 1 is not impaired and the particle 3 is moved or removed by the scan with the stylus. With regard to the hard particle, the stylus is replaced by the hard stylus 4 and the particle 3 is physically removed by the scanning of the stylus 4 with a high load.

What is claimed is:

1. A method of removing a particle of a photomask using an atomic force microscope comprising:
    pressing a hard atomic force microscope stylus having a spring constant equal to or larger than 300 N/m to a particle;
    detecting bending of a cantilever relative to a press force;
    determining a kind of the particle from an amount of the bending; and
    changing the method of removing the particle in accordance with the kind of the particle.

2. A method of removing a particle of a photomask using an atomic force microscope comprising:
    pressing a hard atomic force microscope stylus having a spring constant equal to or larger than 300 N/m to a particle with a constant load;
    measuring a depth of an impression produced by pressing the particle by a stylus which is slender and provided with a high aspect ratio;
    determining a kind of the particle by a difference in the measured depth; and
    changing the method of removing the particle in accordance with the kind of the particle.

3. A method of removing a particle of a photomask using an atomic force microscope according to claim 1, wherein when the particle is softer than a quartz or glass substrate, an atomic force microscope stylus harder than the particle and softer than the quartz or glass substrate is used and the particle is physically removed by pressing a side face of the stylus to the particle.

4. A method of removing a particle of a photomask using an atomic force microscope according to claim 2, wherein when the particle is softer than a quartz or glass substrate, an atomic force microscope stylus harder than the particle and softer than the quartz or glass substrate is used and the particle is physically removed by pressing a side face of the stylus to the particle.

5. A method of removing a particle of photomask using an atomic force microscope according to claim 1, wherein only when the particle is equal to or harder than a quartz or glass substrate, a hard atomic force microscope stylus having a high spring constant used for pressing the particle is used as it is and the particle is physically removed by pressing a side face of the stylus to the particle.

6. A method of removing a particle of photomask using an atomic force microscope according to claim 2, wherein only when the particle is equal to or harder than a quartz or glass substrate, a hard atomic force microscope stylus having a high spring constant used for pressing the particle is used as it is and the particle is physically removed by pressing a side face of the stylus to the particle.

* * * * *